United States Patent [19]

Batra

[11] Patent Number: 4,513,494
[45] Date of Patent: Apr. 30, 1985

[54] LATE MASK PROCESS FOR PROGRAMMING READ ONLY MEMORIES

[75] Inventor: Tarsaim Batra, Cupertino, Calif.

[73] Assignee: American Microsystems, Incorporated, Santa Clara, Calif.

[21] Appl. No.: 516,064

[22] Filed: Jul. 19, 1983

[51] Int. Cl.³ .................... H01L 21/265; B01J 17/00
[52] U.S. Cl. .................................. 29/576 B; 29/571; 29/578; 148/187; 357/91; 357/23.6
[58] Field of Search .................. 148/1.5, 187; 29/571, 29/576 B, 578; 357/91, 234

[56] References Cited

U.S. PATENT DOCUMENTS

| | | | |
|---|---|---|---|
| 4,235,011 | 11/1980 | Butler et al. | 29/571 |
| 4,272,303 | 6/1981 | Chatterjee et al. | 148/1.5 |
| 4,294,001 | 10/1981 | Kuo | 29/571 |
| 4,329,186 | 5/1982 | Kotecha et al. | 148/1.5 |
| 4,356,042 | 10/1982 | Gedaly et al. | 148/1.5 |
| 4,358,889 | 11/1982 | Dickman et al. | 29/571 |
| 4,364,165 | 12/1982 | Dickman et al. | 29/571 |
| 4,364,167 | 12/1982 | Donley | 29/576 B |
| 4,380,866 | 4/1983 | Countryman, Jr. et al. | 29/577 C |
| 4,384,399 | 5/1983 | Kuo | 29/571 |
| 4,406,049 | 9/1983 | Tam et al. | 29/571 |

Primary Examiner—Upendra Roy
Attorney, Agent, or Firm—Steven F. Caserza; Alan H. MacPherson

[57] ABSTRACT

A late mask programming process is provided for factory programmed ROMs or logic circuitry. MOS transistors functioning as ROM cells or in logic circuitry are fabricated by a standard MOS Process. Then, a thin stop layer of silicon nitride is provided over the transistors followed by a layer of silicon dioxide. Programming is accomplished by applying a program mask and etching through the layers overlying the gate regions of selected transistors down to the silicon nitride stop layer. The silicon nitride stop layer prevents overetching and shorting of the gates. Then, ions are implanted underneath the gates of the selected MOS transistors to alter their threshold so, for example, as ROM cells they signify a different state than those cells whose transistor gates are not implanted with ions. The silicon nitride layer serves to stop the etch solution but permits the ions to pass through, penetrate the substrate and raise the thresholds of the selected transistors. The silicon dioxide layer stops the ions from being implanted into the nonselected transistors.

14 Claims, 13 Drawing Figures

LATE MASK PROCESS FOR PROGRAMMING READ ONLY MEMORIES

This invention relates to a process for programming read only memories and, more particularly, relates to a process for factory programming individual read only memory cells late in the process sequence.

In the semiconductor industry the fabrication of devices has progressed from discrete devices to devices integrating multiple devices on the same ship. Such integrated devices have progressed from small scale integration, to medium scale integration, to large scale integration and now to very large scale integration. These integrated devices typically have been designed by semiconductor manufactures with the view to satisfying the requirements of a broad range of customers. Such customers could pick and choose from the offerings of all domestic and foreign commercial suppliers of standard semiconductor devices. For many applications, however, standard devices of this type have not been available to optimally meet the requirements of the particular application. For extremely high volume applications, large companies have been able to custom order parts or, in some cases, have set up in-house fabrication facilities to produce their own semiconductor devices to their own specifications. Small companies or low volume applications have not been able to advantageously utilize such custom fabrication. More recently, a number of companies have offered custom semiconductor devices based on so-called gate arrays which are alterable during various stages of the fabrication process in accordance with the design of the customer. These so-called silicon foundries are believed to provide a satisfactory answer to the system requirements of many users, particularly low-volume users. However, it is imperative that they do not introduce delays into the system design and development cycle.

In addition to the logic arrangements of gate arrays, programmable memory arrays such as read only memories (ROMs) are now in widespread use. The memory patterns in ROMs may also be fixed at the factory to reflect initial or reference data provided by the customer or may be programmed in the field by fusing links or by electrically programming EPROMs. In programming ROMs at the factory the requirement has been the relatively straightforward one of programming a predetermined pattern into the available cells of the memory during fabrication. The manufacturer of ROMs, by some means, incorporates into its process a bit map provided by the customer which will determine the state (ones or zeros) of each bit in the ROM.

In the programming of ROMs at the factory, the conventional approaches have involved process steps at intermediate stages of the process sequence. Thus, once a customer has placed an order, it has always been necessary to carry out the programming step and then complete the processing of the wafers through all the rest of the processing steps. This necessity has resulted in significant turnaround time from customer order to availability of prototype. The standard ROM fabrication technologies have required that the ROM cell, a single MOS transistor, be programmed to its zero-logic state by various techniques, techniques which have occurred early in the process sequence or which have unduly enlarged the cell size. For example, the oxide is sometimes made thicker under certain ones of the transistors, thereby increasing the threshold voltage of the transistor. Or, in the contact mask, the zero-state may be obtained by not making contacts to those gates requiring a zero-state. And in one process gates are not formed over selected prospective MOS transistors. See C. K. Kuo, "Method of Making a Metal Programmable MOS Read Only Memory Device," U.S. Pat. No. 4,384,399; see also the references and discussion therein. In some processes the zero-state is programmed in the metal mask by not making an electrical connection with the gate and in still other processes the sources or drains are offset from the gate for selected transistors which are to have a zero state; see R. S. Countryman, et al., "Method of Programming ROM by Offset Masking of Selected gates", U.S. Pat. No. 4,380,866. See, e.g., C. K. Kuo, "Post-Metal Programmable MOS Read Only Memory," U.S. Pat. No. 4,390,971. And in still other MOS processes, the programming of ROM cells occurs by implanting ions through polysilicon layers in selected transistors to increase the threshold to render them nonconductive and produce the zero state. With all of the above programming techniques, the programming occurs while the devices are being defined or incur a Penalty in increasing cell size.

It is therefore an object of the present invention to provide a process sequence for producing custom ROMs wherein ROM programming occurs late in the process sequence.

It is an additional object of the present invention to provide a process for factory programming ROM, which does not add to cell size.

It is another object of the present invention to provide a process for producing custom programmed ROMs wherein a nitride layer is provided under the field oxide and gate oxide to permit a late implantation under the gate without harming the gate.

BRIEF DESCRIPTION OF THE DRAWINGS

For a more complete understanding of the process of the present invention, reference may be had to the accompanying drawings which are incorporated herein by reference and in which.

SUMMARY OF THE INVENTION

Figure 1:
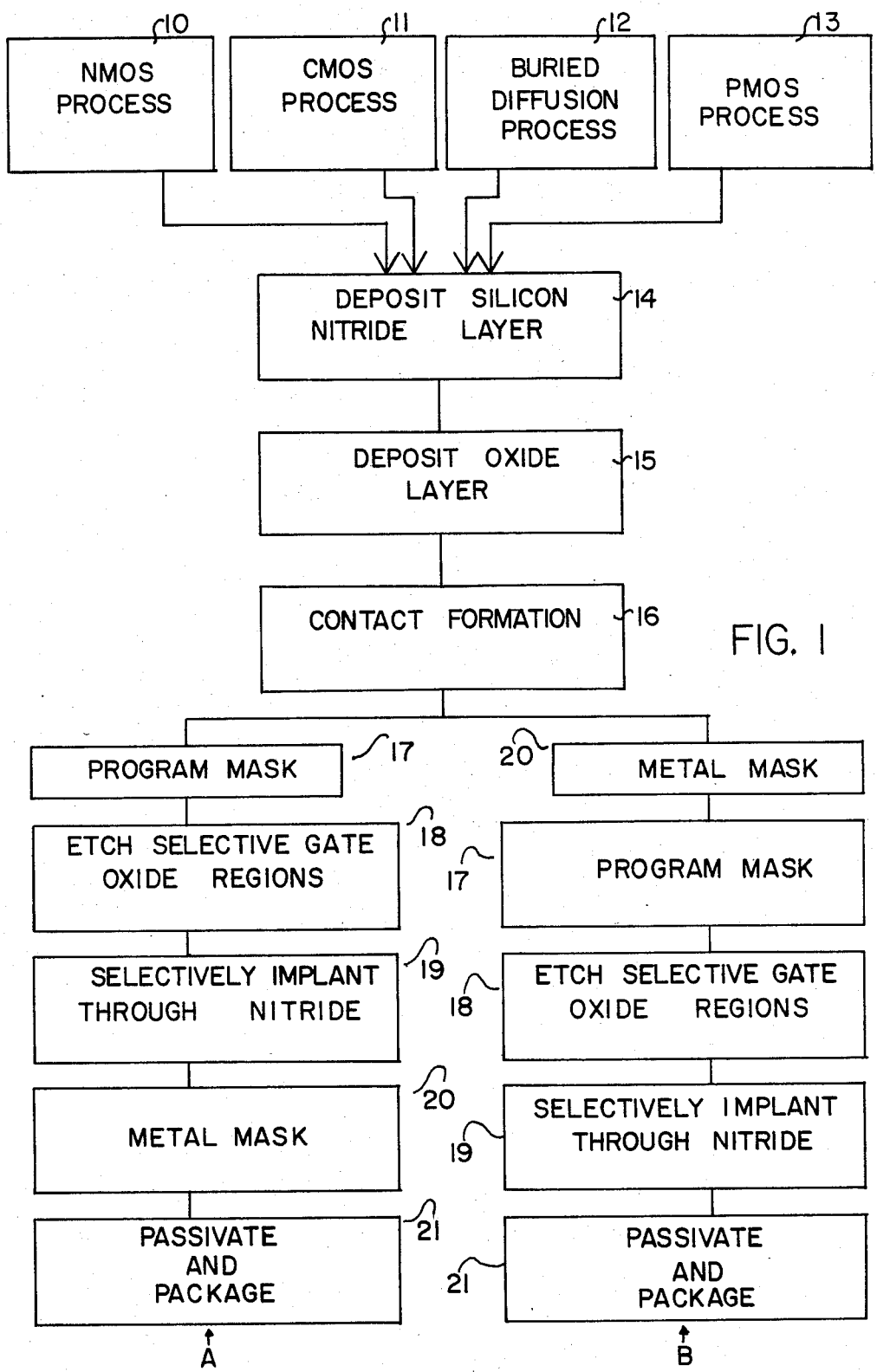
FIG. 1 is a block diagram showing the alternate fabrication technologies which may utilize, at the end of the process sequence, a programmable mask in accordance with the present invention.

A late mask programming process is provided for factory programmed ROMs or logic circuitry. MOS transistors functioning as ROM cells or included in a logic circuit are fabricated by a standard MOS process. Then, a thin stop layer of silicon nitride is provided over the transistors followed by a layer of silicon dioxide. After definition of contacts to active device regions, programming is accomplished by etching through the layers overlying the gate regions of selected transistors down to the silicon nitride stop layer. The silicon nitride stop layer prevents over-etching and shorting of the gates of the selected transistors. Then ions are implanted underneath the gates of the selected MOS transistors to raise their threshold so, for example, as ROM cells they signify a different state than those cells whose transistor gates are not implanted with ions because the ions are stopped by the remaining overlying silicon dioxide. The silicon nitride serves to stop the etch solution but permits the ions to pass through to penetrate the substrate. In an alternate embodiment the programming and all subsequent steps are accomplished after the metal mask step.

DESCRIPTION OF THE PREFERRED EMBODIMENT

In producing custom integrated circuits, the overall Process typically has four major stages. The diffusion or implantation stage defines and produces those areas such as sources or drains that are to serve as active electrical regions. The metal layer design stage interconnects the active electrical regions by conductive lines of metal or doped polysilicon to interconnect individual transistors (or cells) into logic or memory arrangements. The wafer personalization stage is where, in accordance with a customer's design, particular logic building blocks are selected and interconnected or where, if not previously accomplished, ROM cells are programmed in accordance with the bit map of a customer. Then, in the final stage the device is packaged and tested. As described above, the conventional approach to programming ROM cells is to carry out the programming in stages 1 to 3 and typically early in the overall process sequence. With the several techniques described above which occur late in the process sequence, a penalty in increased cell size is incurred.

As described previously, the conventional techniques for factory programming ROMs often include process steps which are carried out early in the process sequence. For example, the programming of the field oxide by providing thick oxide underneath certain transistors occurs as early as the field oxide definition step shown in FIG. 2c. The omission of a gate over a particular prospective transistor could occur as early as step 2f. Selectively contacting the gates is a programming technique which occurs in the process at about the steps indicated in FIG. 2j, and, the omission of a metal interconnect through the metal mask occurs at about the step indicated in FIG. 2k. Either these steps occur relatively early in the process sequence or they result in a bigger cell size. Ideally, for the fast turnaround of a ROM to be custom programmed, a custom IC company would have wafers on the fully processed to the point of programming. With the late mask programming technique of the present invention, the setting of the state of a particular MOS transistor or ROM cell does not occur until the stage of the process indicated by FIG. 2k. Cell size is not increased; only the threshold level of selected cells is altered. Wafers can be stored with all processing completed up to the stage of FIG. 2k and then rapidly completed with the last several steps up to final packaging. This permits extremely fast turnaround for customers once they supply a bit map for programming of custom ROMs. Turnaround time can thus be measured in two to three days rather than in two to three weeks.

The process sequences for various embodiments of the present invention in the context of programming ROMs may be seen in the block diagram of FIG. 1. Any conventional MOS process for ROMs may be utilized to define the individual transistors. Thus, NMOS process 10, CMOS process 11, buried diffusion process 12 or PMOS process 13 may be utilized up to the stage of definition of the transistors. At this time in the personalization, a stop layer of silicon nitride is applied in step 14. This thin layer of about 100 angstroms to about 1000 anstroms serves later to prevent over-etching of the oxide in selective etch step 18, as described in detail subsequently. Next, an oxide layer is applied by conventional vapor deposition techniques to a thickness of approximately 10,000Å. Then the contacts are formed in step 16 to the individual sources and drains and to the poly interconnects and to gates. In embodiment A at this late time in processing a program mask with the bit map for programming the ROM is applied in step 17 to open up the oxide above the gates of those MOS transistors which are to be programmed to the zero state. The oxide above the gates of these transistors is etched in step 18, down to the thin silicon nitride layer applied previously in step 14. Preferably, an etch is used which preferentially etches silicon dioxide over silicon nitride. The thin nitride layer, as described in detail subsequently, prevents over-etching so that there is no shorting of the gates to the source, drain or substrate regions. Then an ion implantation step 19 is carried out to raise the thresholds of those MOS transistors whose gates are exposed. The oxide remaining over the gates of the other MOS transistors prevents them from being affected during the ion implantation. The devices are then processed through standard processing techniques including metal evaporation and metal masking in step 20 and passivating and packaging in step 21. In embodiment B the metal evaporation and metal mask step 20 is carried out immediately after contact formation step 16. Thereafter, the program mask with the bit map for programming the ROM is applied in step 17 to open up the oxide above the gates of those MOS transistors which are to be programmed to the zero state. The oxide above the gates of these transistors is then etched in step 18, down to the thin silicon nitride layer applied previously in step 14. In embodiment B, the thin nitride layer, as with embodiment A, prevents overetching so that there is no shorting of the gates to the source, drain or substrate regions. Then the ion implantation step 19 is carried out to raise the thresholds of those MOS transistors whose gates are exposed. The oxide remaining over the gates of the other MOS transistors prevents them from being affected during the ion implantation. The devices are then passivated and packaged in step 21.

Figure 2A:
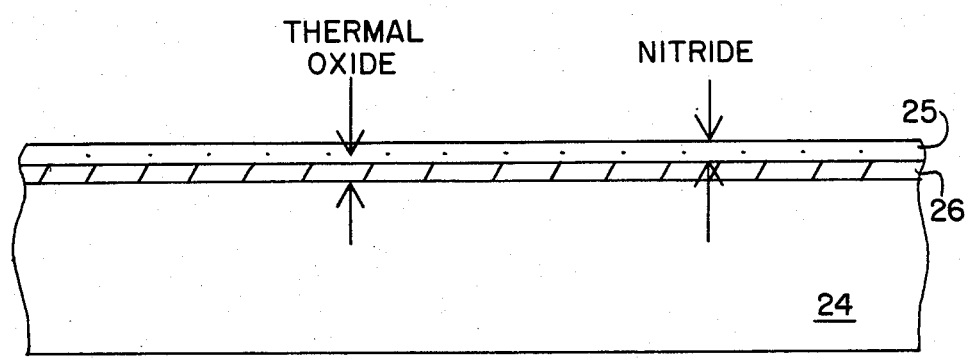
FIGS. 2a—2l are a series of cross-sectional views of an MOS transistor being formed by an MOS process (FIGS. 2a-2g) and then being programmed (FIGS. 2h-2) in accordance with the process of the present invention.
Figure 2B:
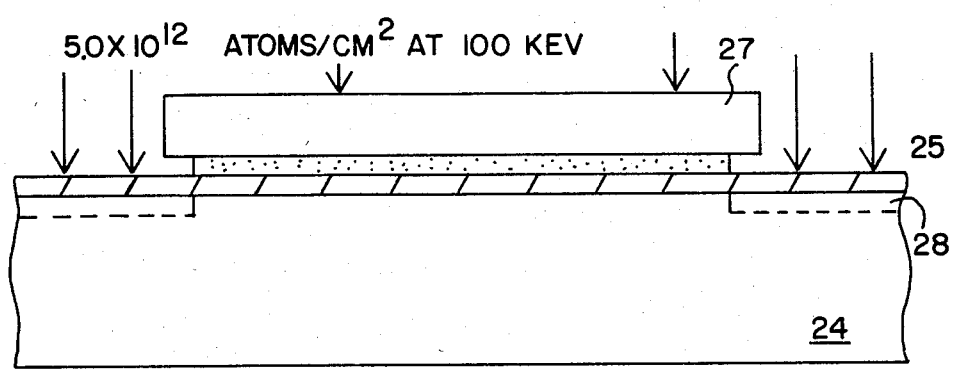
Figure 2C:
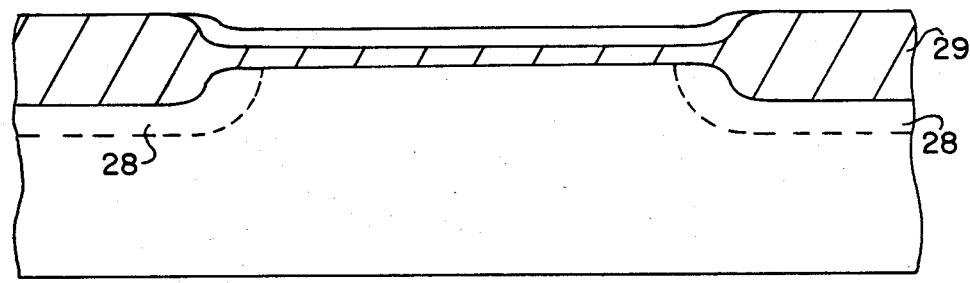
Figure 2D:
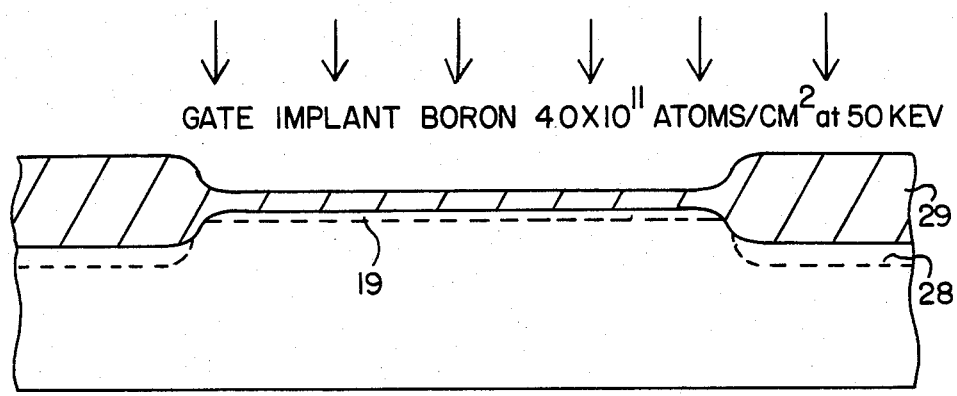
Figure 2E:
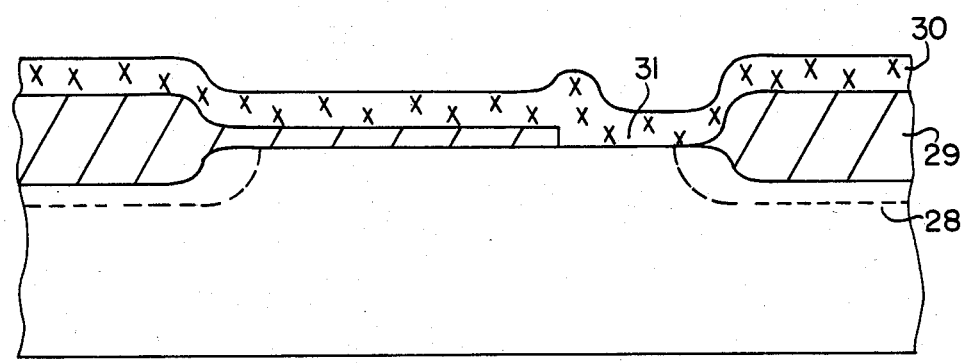
Figure 2F:
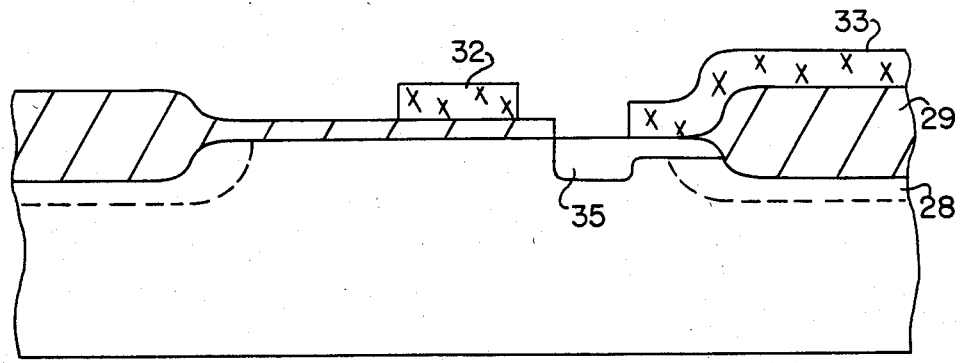
Figure 2G:
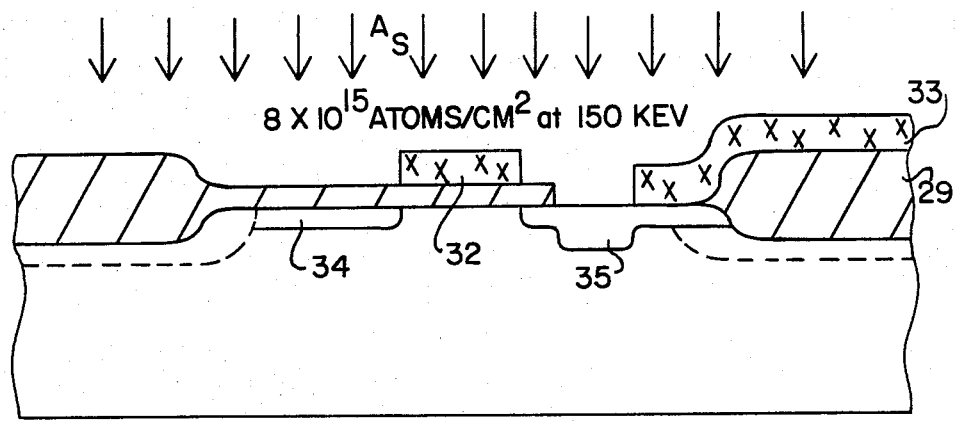
Figure 2H:
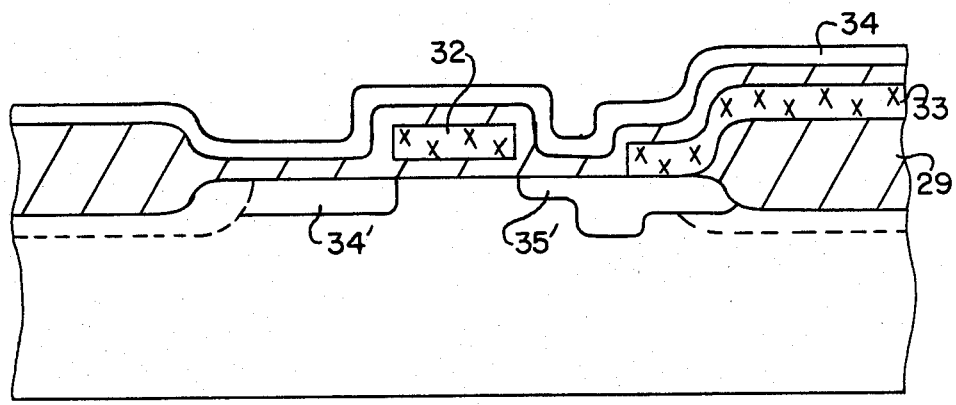
Figure 2I:
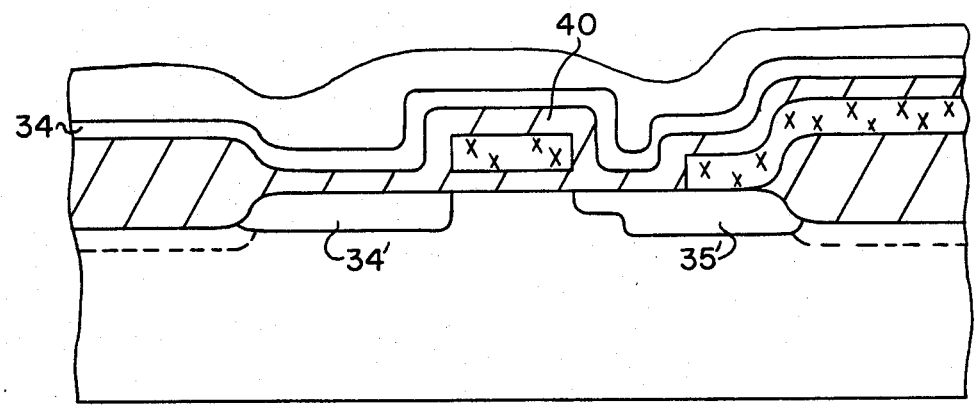
Figure 2J:
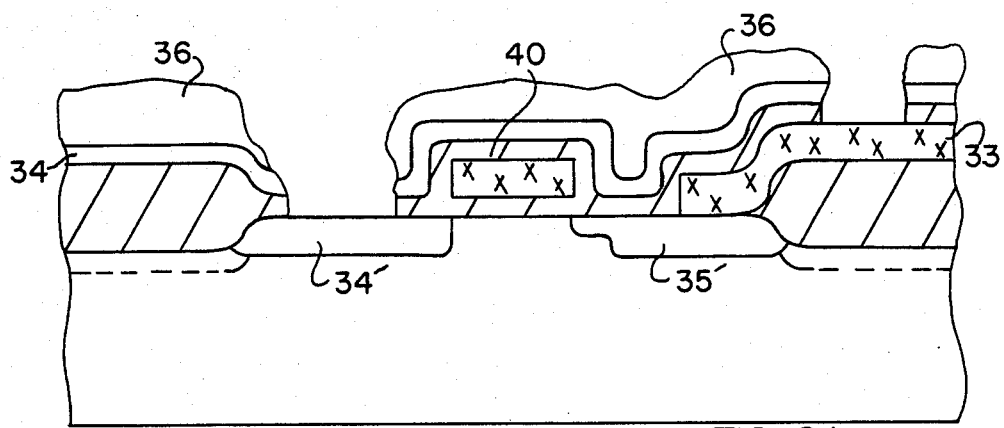
Figure 2K:
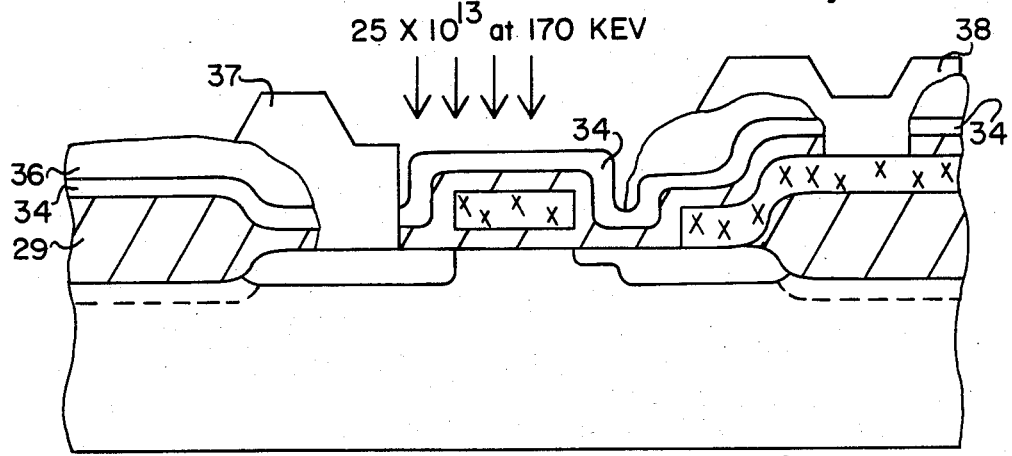
Figure 2L:
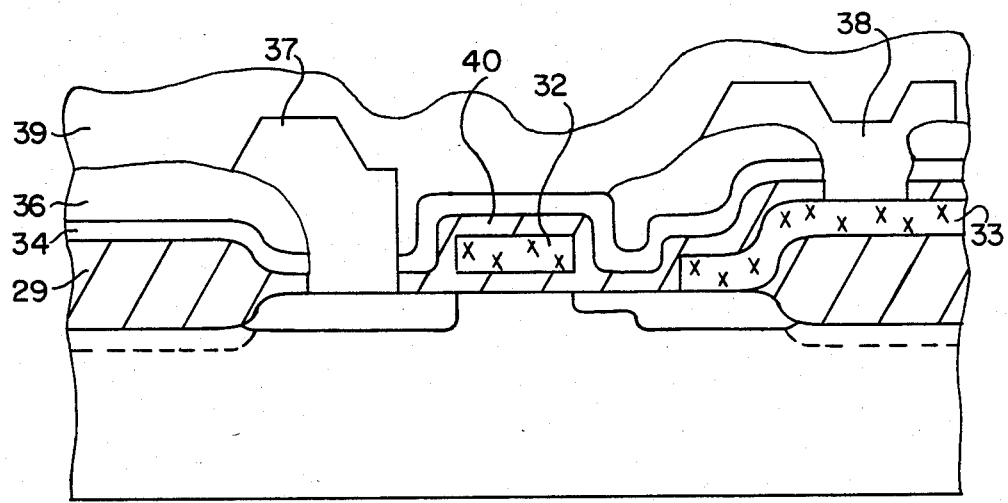

To fully examine the process sequence of embodiment A of the present invention and to particularly point out the stages at which programming is done in the prior art as compared with the process of the present invention, reference should be made to the process sequence shown in FIGS. 2a–2l. As discussed above, the portions of this specific process through definition of the transistors may vary with other embodiments but will remain the same for the application of the stop layer of silicon nitride and the programming steps. The process sequence shown for defining the transistors is an NMOS process. In FIG. 2a, a silicon wafer 24 has a thin layer 26 of thermal oxide grown on its surface. A 700Å layer of silicon nitride 25 is deposited on the surface of silicon oxide 26. In FIG. 2b the lateral expanse of a single MOS transistor is shown underneath resist region 27 and between field oxide areas to be formed. The transistor is exemplary of each transistor in a standard read-only memory array. The nitride layer 25 is etched everywhere except under the resist. Subsequently, a field implant 28 of $5 \times 10^{12}$ atoms per square centimeter is introduced into the silicon substrate 24 through the exposed oxide layer 25 at an implantation energy of 100 kilovolts. Field oxide 29 is then thermally grown as shown in FIG. 2c. The field implant 28 is slightly diffused outwardly as a result of the high-temperature process. An implantation of boron at $4 \times 10^{11}$ atoms per square centimeter is carried out at an implantation energy of 50 kiloelectron-volts as shown in FIG. 2d to produce the gate implant region 9 and to provide the threshold voltage of the gate, typically about one volt. The implantation levels will vary as device requirements dictate. In a preferred embodiment before the gate implant is carried out, the initial oxide and nitride layers are stripped and a thin gate oxide is intentionally grown. Next, as shown in FIG. 2e, a section 31 of the surface of the silicon wafer 24 is opened up above the drain source region to be formed. The oxide is removed by chemical or dry plasma etching while a poly contact mask is in place. A layer 30 of highly doped polycrystalline silicon is then applied to contact the drain region to be formed. The polysilicon is defined in FIG. 2f to leave a gate region 32 and an interconnection 33 which makes electrical contact with the drain region 35 which has not been formed.

The final step in the definition of the MOS transistor is accomplished by the implantation shown in FIG. 2g. In this embodiment, $8 \times 10^{15}$ atoms per square centimeter of arsenic is implanted at an implantation energy of 75 kiloelectron-volts. These ions are driven through the thin oxide over the source region 34 and are also driven into a drain region 35. In order to drive the arsenic further into the silicon substrate 24, a high-temperature thermal drive-in diffusion is carried out at a temperature on the order of 1050° C. for about 15–20 minutes. This thermal drive-in produces source region 34' and drain region 35'. As a consequence of the thermal drive-in, the field oxide 29 is slightly increased in size and oxide layer 40 grows over gate 32 and over the exposed surface of drain region 35', source region 34', and polysilicon interconnect 33. This oxide region 40 will remain over the gate for the duration of processing. The MOS transistor illustrated in this process sequence is now fully formed and would be operational upon the application of gate, source and drain contacts and the application of appropriate signals. It is at this late stage in the process sequence that the setting of the transistor to a zero state is accomplished. In accordance with the process of the present invention, a very thin layer 34 of silicon nitride is then applied to the entire surface. Preferably, this layer has a thickness of 100–1000Å. The layer is thick enough to prevent overetching by an etch which preferentially etches silicon dioxide over silicon nitride, such as dilute hydrofluoric acide, but is thin enough to permit ions to be implanted therethrough as described subsequently. Thereafter, as shown in FIG. 2i, a layer 36 of deposited oxide (called PVX) is applied over the entire structure. Typically, this will be deposited by chemical vapor deposition and have a thickness of about 10,000Å. The PVX serves to insulate underlying layers from overlying metal lines and stops ions from being implanted into transistors whose thresholds are not to be altered. As shown in FIG. 2j, a contact mask is now used to open up access to the source 34', the drain 35', the polysilicon 33 and all other regions to which electrical contacts are to be made. The wafers are then processed through source and drain metallization to define interconnects to sources, drains, gates and polysilicon lines. Note defined interconnects 37 and 38 in FIG. 2k.

Up to this point in processing, no programming of ROM cells has occurred. Any logic transistors on the chip have been formed and indiscriminately interconnected and all ROM cells are formed and potentially operational. Subsequently, by programming, the transistors are rendered disfunctional in certain ROM cells or in certain portions of the logic circuitry by raising their thresholds so high, typically higher than 5 volts, so that they are will not function in the normal operation of the circuit. When a particular customer provides a bit map or specifies logic circuitry, stored wafers may be taken out and processed in accordance with the bit map or circuit logic. The setting of an individual MOS transistor to a zero state is accomplished by masking the PVX oxide in accordance with the bit map as layed out on a program mask (step 17 in FIG. 1) and then etching through the PVX oxide down to the silicon nitride stop layer. Then, in one embodiment, to increase the thresholds of the selected transistors approximately $25 \times 10^{13}$ atoms of boron per square centimeter is implanted at an energy of about 170 kiloelectron-volts. In another embodiment a species of opposite conductivity type is implanted to lower the threshold. What is required is that one set of transistors have one threshold level and another set have a different threshold level with the two levels being sufficiently separated to permit reliable differential detection.

In accordance with the process of present invention, the presence of silicon nitride layer 34 has allowed the etching over the selected gate regions to occur without over-etching and shorting of the gate to the source or drain regions or to the substrate. The silicon nitride acts as an etch stop once the etch has penetrated the overlying PVX and hence the etchant will not reach and attack the underlying layers. In other processes where implantation is used to alter threshold levels, without the presence of the nitride layer 34, any attempt to open up the areas of the gate region for implantation would have potentially resulted in the shorting of the gate. The implanted ions pass through the opened up region of the thin nitride layer, penetrates the gate region and enter the silicon under the gate to thereby raise the threshold to above five volts. The ions are stopped by the PVX elsewhere. In accordance with the preferred embodiment of the process of this invention, this programming occurs after contact formation (step 16, FIG. 1). After this late process step the ROM array is now fully programmed so that only a few steps yet remain such as passivation, pad mask, scribing and packaging of the completed custom ROM; if logic circuitry is also onboard, the logic pattern will also have been established by raising the thresholds of selected transistors and effectively removing them from the circuits. After the programming, a passivating layer of silicon nitride 39 is applied over the whole surface. The integrated circuits containing the individual ROMs of FIG. 21 are then scribed and packaged and provided to the customer. The completed integrated circuit will contain certain ROM cells which are operational transistors and other ROM cells whose threshold have been raised and are effectively disfunctional in normal operation.

In embodiment B of FIG. 1, each of the individual steps of metal mask 20, program mask 17, selective gate etch 18, selective implant 19 and passivate and package 21 are carried out as described above for embodiment A. The program mask step 17 is carried out one step later than in embodiment A thereby permitting the metal mask step 20 to be carried out earlier in the process and slightly shortening the turnaround time from receipt of the customer's map to availability of prototype. The presence of the silicon nitride stop etch layer applied by step 14 is the key in both embodiments B and A to allowing the implantation step to be used effectively so late in the processing sequence.

I claim:

1. A process for producing a custom programmed read-only memory (ROM) in a semiconductor wafer, comprising:

fabricating in said wafer an array of MOS transistors, said MOS transistors being fabricated up to the stage of contact formation, each said MOS transistor having a source region, a drain region spaced apart from said source region, a channel region located between said source and drain region, and a gate located above and insulated from said channel region;

forming a protective layer over said MOS transistors;

forming an insulating layer over said protective layer, said insulating layer being of a thickness sufficient to absorb ions which are subsequently implanted;

forming vias to selected ones of said source and drain regions in said transistors through said protective layer and through said insulating layer;

forming electrical interconnections to said selected ones of said source and drain regions;

thereafter forming a program mask on said wafer, said mask exposing those portions of said insulating layer located above the channel regions of selected transistors in said array of transistors;

removing the exposed portions of said insulating layer to expose said protective layer; and implanting ions through said protective layer into said channel regions of said selected transistors to alter the threshold voltages of said selected transistors, the remaining portions of said insulating layer serving to stop passage of said ions.

2. A process in accordance with claim 1 wherein said step of implanting ions is accomplished by the step of implanting ions through said protective layer whereby the threshold voltages of said selected transistors are lowered.

3. A process in accordance with claim 1 wherein said step of implanting ions is accomplished by the step of implanting ions through said protective layer whereby the threshold voltages of said selected transistors are raised.

4. A process in accordance with claim 1 wherein said step of fabricating an array of MOS transistors is accomplished by the step of fabricating an array of MOS transistors by practicing an NMOS process.

5. A process in accordance with claim 1 wherein said step of fabricating an array of MOS transistors is accomplished by the step of fabricating an array of MOS transistors by practicing a CMOS process.

6. A process in accordance with claim 1 wherein said step of fabricating an array of MOS transistors is accomplished by the step of fabricating an array of MOS transistors by practicing a buried diffusion process.

7. A process in accordance with claim 1 wherein said step of fabricating an array of MOS transistors is accomplished by the step of fabricating an array of MOS transistors by a PMOS process.

8. A process in accordance with claim 1 wherein said step of fabricating an array of MOS transistors is accomplished by the step of fabricating an array of MOS transistors wherein each said transistor comprises a ROM cell.

9. A process in accordance with claim 1 wherein said step of fabricating an array of MOS transistors is accomplished by the step of fabricating an array of MOS transistors wherein at least one of said transistors is incorporated in a logic circuit.

10. A process in accordance with claim 1 wherein said step of forming a protecting layer is accomplished by the step of forming a layer of silicon nitride having a thickness in the range of approximately 100Å to 1000Å.

11. A process in accordance with claim 1 wherein said step of forming an insulating layer is accomplished by forming a layer of silicon dioxide having a thickness in the range of approximately 7,000Å 10,000Å.

12. A process in accordance with claim 1 wherein said step of forming a protective layer is accomplished by the step of forming a layer of silicon nitride.

13. A process in accordance with claim 1 wherein said step of forming an insulating layer is accomplished by the step of forming a layer of silicon dioxide.

14. A process for adjusting the threshold voltage of an MOS transistor comprising:

fabricating in a semiconductor wafer an MOS transistor, said MOS transistor being fabricated up to the stage of contact formation and having a source region, a drain region spaced apart from said source region, a channel region located between said source and drain regions, and a gate located above and insulated from said channel region;

forming a protective layer over said MOS transistor;

forming an insulating layer over said protective layer, said insulating layer being of a thickness sufficient to absorb ions which are subsequently implanted;

forming vias to selected ones of said source and drain regions through said protective layer and through said insulating layer;

forming electrical interconnects to said selected ones of said source and drain regions;

thereafter, applying a mask to said wafer, said mask exposing the portion of said insulating layer located above said channel region of said MOS transistor if said MOS transistor is to have its threshold voltage adjusted and said mask not exposing the portion of said insulating layer located above said channel region if said MOS transistor is not to have its threshold voltage adjusted;

removing the exposed portions of said insulating layer to expose said protective layer; and implanting ions through said protective layer into said channel region of said MOS transistor if said insulating layer located above said channel region is removed, thereby altering the threshold voltage of said MOS transistor, the remaining portions of said insulating layer serving to stop passage of said ions.

* * * * *